United States Patent
Washino et al.

(10) Patent No.: US 9,029,970 B2
(45) Date of Patent: May 12, 2015

(54) SEMICONDUCTOR LIGHT RECEIVING DEVICE AND METHOD OF MANUFACTURING THE SAME

(75) Inventors: Ryu Washino, Fujisawa (JP); Yasushi Sakuma, Tokyo (JP); Hiroshi Hamada, Yokohama (JP)

(73) Assignee: Oclaro Japan, Inc., Kanagawa (JP)

( * ) Notice: Subject to any disclaimer, the term of this patent is extended or adjusted under 35 U.S.C. 154(b) by 90 days.

(21) Appl. No.: 13/069,422

(22) Filed: Mar. 23, 2011

(65) Prior Publication Data

US 2011/0233708 A1 Sep. 29, 2011

(30) Foreign Application Priority Data

Mar. 29, 2010 (JP) ................................. 2010-075745

(51) Int. Cl.
*H01L 31/0232* (2014.01)
*H01L 31/0216* (2014.01)
*H01L 31/107* (2006.01)

(52) U.S. Cl.
CPC ........ *H01L 31/02161* (2013.01); *H01L 31/107* (2013.01)

(58) Field of Classification Search
CPC .............. H01L 51/5284; H01L 31/052; H01L 31/0522; H01L 33/10; H01L 31/0232
USPC .............. 257/436, E31.127, E31.119; 438/72
See application file for complete search history.

(56) References Cited

U.S. PATENT DOCUMENTS

2008/0265357 A1 10/2008 Toyonaka et al.

FOREIGN PATENT DOCUMENTS

| JP | 11-068144 | 3/1999 |
| JP | 2004-200202 | 7/2004 |
| JP | 2008-270529 | 11/2008 |

*Primary Examiner* — Elias M Ullah
(74) *Attorney, Agent, or Firm* — Mattingly & Malur, P.C.

(57) ABSTRACT

Provided is a semiconductor light receiving device including: a semiconductor substrate; a semiconductor layer laminated on the semiconductor substrate and including an upper surface portion; a reflecting film formed to cover the upper surface portion of the semiconductor layer and including a principal reflecting region and an upper surface; and an upper electrode formed to cover at least one portion of the upper surface of the reflecting film, and including a junction portion extending through the reflecting file to be provided in contact with the upper surface portion of the semiconductor layer, the junction portion of the upper electrode surrounding a portion of a circumference of the principal reflecting region of the reflecting film, the principal reflecting region being connected to a region of the reflecting film located outside the junction portion, in which the semiconductor light receiving device detects light entering from another side of the semiconductor substrate.

5 Claims, 8 Drawing Sheets

SEMICONDUCTOR LIGHT RECEIVING DEVICE AND METHOD OF MANUFACTURING THE SAME

CROSS-REFERENCE TO RELATED APPLICATION

The present application claims priority from Japanese application JP 2010-075745 filed on Mar. 29, 2010, the content of which is hereby incorporated by reference into this application.

BACKGROUND OF THE INVENTION

1. Field of the Invention

The present invention relates to a semiconductor light receiving device and a method of manufacturing the semiconductor light receiving device, and more particularly, to an increase in yield due to an improvement of an electrode shape of a semiconductor light receiving device of a rear-surface incident type.

2. Description of the Related Art

Up to now, there is a semiconductor light receiving device in which a semiconductor multilayer including a light absorbing layer is formed on a semiconductor substrate and a reflecting film is formed to cover the semiconductor multilayer. An electrode is formed to cover a portion of the reflecting film. A predetermined portion (shape) of the reflecting film is removed to form a through hole. The electrode is electrically connected to the semiconductor multilayer through the through hole.

The semiconductor light receiving device as described above is called a semiconductor light receiving device of a rear-surface incident type because light entering from the semiconductor substrate (rear surface) side is absorbed in the light absorbing layer and then a current caused by the absorbed light is detected. For example, a structure of the semiconductor light receiving device of the rear-surface incident type is described in JP 2004-200202 A.

The semiconductor light receiving device includes the reflecting film formed to cover the semiconductor multilayer, and hence light passing through the semiconductor multilayer is reflected on the reflecting film and absorbed in the light absorbing layer. Therefore, the light receiving sensitivity of the semiconductor light receiving device is further improved.

SUMMARY OF THE INVENTION

FIG. 5A is a schematic cross sectional view illustrating a semiconductor light receiving device normally manufactured by a manufacturing method according to a conventional technology. In FIG. 5A, a semiconductor multilayer 220 has a mesa structure in which a cross section through a lateral direction is circular and a diameter of the cross section reduces with an increase in distance from a substrate in an up-direction. A reflecting film 211 is formed on an upper surface and an oblique surface of the semiconductor multilayer 220. A through hole is provided in the reflecting film 211. A p-type electrode 212 (upper electrode) is provided on an upper surface side of the reflecting film 211 and electrically connected to the upper surface of the semiconductor multilayer 220 through the through hole. A portion of the p-type electrode 212 which is formed in the through hole is referred to as a junction portion.

FIG. 4 illustrates a mask pattern of a photo resist 300 in the manufacturing method according to the conventional technology. During a manufacturing process, the reflecting film 211 is formed on the entire upper and oblique surface of the semiconductor multilayer 220. The photo resist 300 is applied to the entire surface of the reflecting film 211. A photolithography technology is employed to expose a white ring region illustrated in FIG. 4. Then, a portion of the photo resist 300 which is located in the white ring region is removed to form only a remaining portion of the photo resist 300 illustrated in FIG. 4, to thereby obtain the mask pattern. The mask pattern of the photo resist 300 as illustrated in FIG. 4 is used to remove a portion of the reflecting film 211 which is located in the white ring region illustrated in FIG. 4 by an etching process, to thereby form the through hole.

FIG. 5B is a cross sectional view after the formation of the mask pattern of the photo resist 300 during the process for manufacturing the semiconductor light receiving device illustrated in FIG. 5A. FIG. 5C is a cross sectional view after the etching process. As described above, after the etching process, the p-type electrode 212 is formed to manufacture the semiconductor light receiving device (FIG. 5A). As illustrated in FIG. 5A, a part of light entering from the lower side of FIG. 5A is reflected on a region of the reflecting film 211 which is located under an inner circular region of the mask pattern of the photo resist 300 illustrated in FIG. 4, and travels toward the light absorbing layer provided in the inner portion of the semiconductor multilayer 220. The region of the reflecting film 211 is referred to as a principal reflecting region. The principal reflecting region of the reflecting film 211 is separated from a reflecting film region located outside the junction portion of the p-type electrode 212.

In order to improve the sensitivity of the semiconductor light receiving device, light entering the semiconductor light receiving device is desirably absorbed in the light absorbing layer as much as possible. In view of isotropy, the principal reflecting region of the reflecting film 211 is generally formed into a circular shape. In general, the ring region surrounding the circumference of the principal reflecting region of the reflecting film 211 is removed, and hence the cross section of the junction portion of the p-type electrode 212 has a ring shape.

However, particularly, when a diameter of the upper surface of the semiconductor multilayer 220 is small as in the case of the semiconductor light receiving device illustrated in FIG. 5A, there are many limits to design the mask pattern of the photo resist 300.

Under a condition in which a diameter of the inner circular region of the mask pattern of the photo resist 300 illustrated in FIG. 4 cannot be sufficiently set or a width (difference between inner diameter and outer diameter) of the white ring region illustrated in FIG. 4 is required to be made large with respect to the diameter of the inner circular region, when an exposure amount in the photolithography technology is large, the inner circular region of the photo resist 300 may disappear. Also during the etching process, the inner circular region of the photo resist 300 may disappear.

FIG. 6A is a schematic cross sectional view illustrating an example of a semiconductor light receiving device abnormally manufactured by the manufacturing method according to the conventional technology. FIG. 6B is a cross sectional view after the formation of the mask pattern of the photo resist 300 during the process for manufacturing the semiconductor light receiving device illustrated in FIG. 6A. FIG. 6C is a cross sectional view after the etching process.

As illustrated in FIG. 6B, the inner circular region of the photo resist 300 disappears. Therefore, as illustrated in FIG. 6C, not the ring through hole but a circular through hole is formed by the etching process. After that, as illustrated in FIG. 6A, the p-type electrode 212 is formed to manufacture the semiconductor light receiving device.

As illustrated in FIG. 6A, a part of incident light is reflected on a lower surface of the p-type electrode 212. However, a reflectance of the p-type electrode 212 is lower than a reflectance of the reflecting film 211. Therefore, an amount of light reflected toward the light absorbing layer reduces to lower the light receiving sensitivity of the semiconductor light receiving device.

In contrast to this, under a condition in which the width of the white ring region illustrated in FIG. 4 is required to be made small because the disappearance of the inner circular region of the photo resist 300 is taken into account, when the exposure amount in the photolithography technology is small, the mask pattern of the photo resist 300 is not sufficiently formed. As a result, there is a case where the through hole is not sufficiently formed.

FIG. 7A is a schematic cross sectional view illustrating another example of a semiconductor light receiving device abnormally manufactured by the manufacturing method according to the conventional technology. FIG. 7B is a cross sectional view after the formation of the mask pattern of the photo resist 300 during the process for manufacturing the semiconductor light receiving device illustrated in FIG. 7A. FIG. 7C is a cross sectional view after the etching process.

As illustrated in FIG. 7B, the mask pattern of the photo resist 300 is not formed. That is, the photo resist 300 is formed on the entire upper surface of the reflecting film 211. Therefore, as illustrated in FIG. 7C, the through hole is not formed by the etching process. After that, as illustrated in FIG. 7A, the p-type electrode 212 is formed to manufacture the semiconductor light receiving device.

As illustrated in FIG. 7A, the p-type electrode 212 is not electrically connected to the semiconductor multilayer 220, and hence a desired electric field cannot be applied to the inner portion of the semiconductor multilayer 220. Therefore, the function of the semiconductor light receiving device cannot be obtained.

The present invention has been made in view of the problems described above. An object of the present invention is to provide a semiconductor light receiving device which ensures an electrical connection between a semiconductor light receiving device electrode and a semiconductor layer and is stably manufactured to improve a yield, and a method of manufacturing the semiconductor light receiving device.

(1) In order to solve the above-mentioned problems, a semiconductor light receiving device according to the present invention includes: a semiconductor substrate; a semiconductor layer which is laminated on the semiconductor substrate and includes an upper surface portion; a reflecting film which is formed to cover the upper surface portion of the semiconductor layer and includes a principal reflecting region and an upper surface; and an upper electrode which is formed to cover at least a portion of the upper surface of the reflecting film and includes a junction portion extending through the reflecting film to be provided in contact with the upper surface portion of the semiconductor layer, the junction portion of the upper electrode surrounding a portion of a circumference of the principal reflecting region of the reflecting film, the principal reflecting region being connected to a region of the reflecting film which is located outside the junction portion, in which the semiconductor light receiving device detects light entering from a side of the semiconductor substrate which is opposed to the semiconductor layer.

(2) In the semiconductor light receiving device as described in the above-mentioned item (1), the principal reflecting region of the reflecting film may have a circular shape and the junction portion of the upper electrode which is provided in contact with the circumference of the principal reflecting region may have a cross section obtained by removing, from a ring-shaped region formed outside the circumference of the principal reflecting region having the circular shape, a region extending from at least one portion of the circumference of the principal reflecting region having the circular shape to an outside.

(3) In the semiconductor light receiving device as described in the above-mentioned item (2), the at least one portion of the circumference of the principal reflecting region may include a first portion of the circumference of the principal reflecting region having the circular shape and a second portion of the circumference of the principal reflecting region having the circular shape, the first portion and the second portion being opposed to each other with respect to a center of the principal reflecting region having the circular shape.

(4) According to the present invention, a method of manufacturing a semiconductor light receiving device for detecting light entering from a side of a semiconductor substrate which is opposed to a semiconductor layer, includes: laminating the semiconductor layer including an upper surface portion on the semiconductor substrate; forming a reflecting film including a principal reflecting region to cover the upper surface portion of the semiconductor layer; forming a resist on an upper surface of the reflecting film; removing a region of the resist which is located on an upper side of a portion of a region surrounding a circumference of the principal reflecting region; removing a region of the reflecting film which is located on the upper side of the portion of the region surrounding the circumference of the principal reflecting region; and forming an upper electrode to include a junction portion formed in the removed region of the reflecting film and cover at least a portion of the upper surface of the reflecting film.

(5) In the method of manufacturing a semiconductor light receiving device as described in the above-mentioned item (4), the principal reflecting region of the reflecting film may have a circular shape and the portion of the region surrounding the circumference of the principal reflecting region may have a shape obtained by removing, from a ring-shaped region formed outside the circumference of the principal reflecting region having the circular shape, a region extending from at least one portion of the circumference of the principal reflecting region having the circular shape to an outside.

(6) In the method of manufacturing a semiconductor light receiving device as described in the above-mentioned item (5), the at least one portion of the circumference of the principal reflecting region may include a first portion of the circumference of the principal reflecting region having the circular shape and a second portion of the circumference of the principal reflecting region having the circular shape, first portion and the second portion being opposed to each other with respect to a center of the principal reflecting region having the circular shape.

According to the present invention, there is provided a semiconductor light receiving device which ensures an electrical connection between a semiconductor light receiving device electrode and a semiconductor layer and is stably manufactured to improve a yield, and a method of manufacturing the semiconductor light receiving device.

DETAILED DESCRIPTION OF THE INVENTION

Hereinafter, a semiconductor light receiving device and a semiconductor light receiving device manufacturing method according to each embodiment of the present invention are described in detail with reference to the attached drawings. The following drawings illustrate the respective embodiments, but the sizes of the drawings are not necessarily equal to the scales described in the embodiments.

[First Embodiment]

A semiconductor light receiving device according to a first embodiment of the present invention is described. The semiconductor light receiving device according to the first embodiment of the present invention is a rear-surface incident type avalanche photo diode (hereinafter, referred to as APD).

Figure 1A:
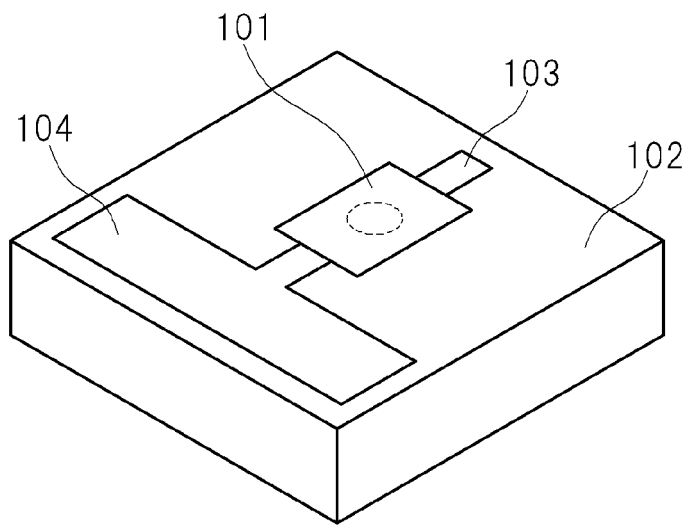
FIG. 1A is an entire perspective view illustrating an assembled finished product in which a rear-surface incident type avalanche photo diode according to a first embodiment of the present invention is mounted on a submount.
Figure 1B:
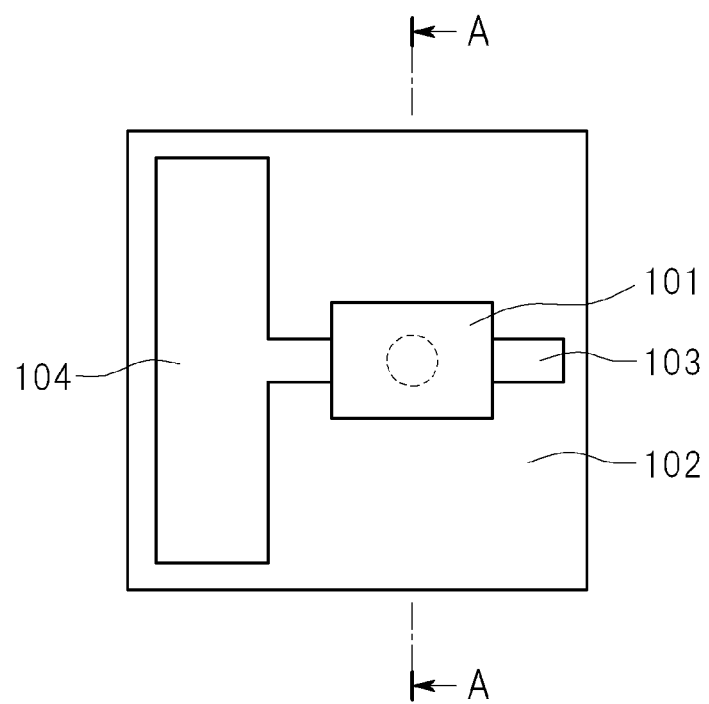
FIG. 1B is a top view illustrating the assembled finished product in which the rear-surface incident type avalanche photo diode according to the first embodiment of the present invention is mounted on the submount.

FIG. 1A is an entire perspective view illustrating an assembled finished product in which the rear-surface incident type APD according to the first embodiment is mounted on a submount. FIG. 1B is a top view illustrating the assembled finished product.

As illustrated in FIGS. 1A and 1B, the rear-surface incident type APD is mounted as an APD device 101 on a submount 102 made of aluminum nitride. A p-type electrode pattern 103 and an n-type electrode pattern 104 are formed on the submount 102. The p-type electrode pattern 103 is connected to a p-type electrode 212 (not shown) which is an upper electrode of the APD device 101. The n-type electrode pattern 104 is connected to an n-type electrode (not shown) of the APD device 101.

Figure 2:
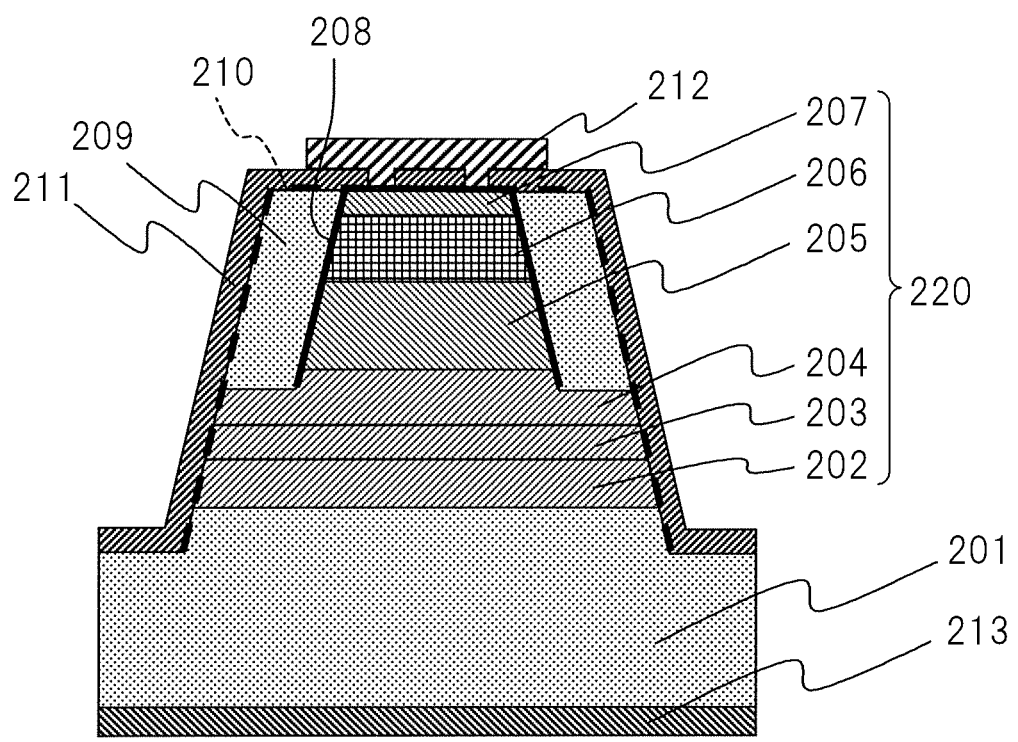
FIG. 2 is a cross sectional view illustrating a structure of the rear-surface incident type avalanche photo diode according to the first embodiment of the present invention.

FIG. 2 is a cross sectional view illustrating a structure of the rear-surface incident type APD according to the first embodiment. For example, FIG. 2 illustrates a principal part taken along the line A-A of FIG. 1B. An n-type InAlAs buffer layer 202, an n-type InAlAs multiplier layer 203, a p-type InAlAs electric field adjusting layer 204, a p-type InGaAs light absorbing layer 205, a p-type InAlGaAs cap layer 206, and a p-type InGaAs contact layer 207 are formed on an upper surface of an n-type InP substrate 201 in this stated order to form a semiconductor multilayer 220. A concentration of the p-type InAlAs electric field adjusting layer 204 disposed between the p-type InGaAs light absorbing layer 205 and the n-type InAlAs multiplier layer 203 is suitably adjusted to apply respective desired electric fields to the p-type InGaAs light absorbing layer 205 and the n-type InAlAs multiplier layer 203.

Of cross sections of the semiconductor multilayer 220, a cross section perpendicular to a laminate direction has a circular shape. The semiconductor multilayer 220 has a mesa structure in which a diameter of the cross section reduces with an increase in distance from the n-type InP substrate 201 in an up-direction. The p-type InAlAs electric field adjusting layer 204 has a structure in which a central portion of the mesa structure is thicker than a peripheral portion thereof, and hence edge breakdown is suppressed.

That is, the p-type InGaAs light absorbing layer 205, the p-type InAlGaAs cap layer 206, and the p-type InGaAs contact layer 207 are gradually reduced in cross sectional diameter from an intermediate portion of the p-type InAlAs electric field adjusting layer 204 in the up-direction (laminate direction) of FIG. 2. This is referred to as a first mesa structure 208. A buried layer 209 is formed around the first mesa structure 208. The n-type InAlAs buffer layer 202, the n-type InAlAs multiplier layer 203, a portion up to the intermediate portion of the p-type InAlAs electric field adjusting layer 204, and the buried layer 209 are gradually reduced in cross sectional diameter from an intermediate portion of the n-type InP substrate 201 in the up-direction (laminate direction) of FIG. 2. This is referred to as a second mesa structure 210. In FIG. 2, the first mesa structure 208 is indicated by a thick line and the second mesa structure 210 is indicated by a broken line.

An insulating reflecting film 211 is formed on the semiconductor multilayer 220 and the buried layer 209, that is, an entire surface of the second mesa structure 210. A portion (shape described later) of an upper surface of the reflecting film 211 is removed to form through holes. The reflecting film 211 serves to reflect light entering from a rear surface of the n-type InP substrate 201 toward the semiconductor multilayer 220 and to protect the semiconductor multilayer 220 and the buried layer 209.

The p-type electrode 212 which is the upper electrode is formed to cover at least a portion of the upper surface of the reflecting film 211. The p-type electrode 212 is electrically connected to the p-type InGaAs contact layer 207 which is an uppermost layer of the semiconductor multilayer 220. A portion of the p-type electrode 212 which is formed in the through holes is referred to as a junction portion. The junction portion of the p-type electrode 212 extends from a portion formed to cover at least the portion of the upper surface of the reflecting film 211 through the reflecting film 211. A lower surface of the junction portion is provided in contact with an upper surface of the p-type InGaAs contact layer 207.

Light travels from the lower side to the upper side in FIG. 2, that is, light enters an inner portion of the rear-surface incident type APD from the rear surface of the n-type InP substrate 201. A part of the light is absorbed in the p-type InGaAs light absorbing layer 205. A part of light which passes through the semiconductor multilayer 220 is reflected on the reflecting film 211 or the lower surface of the junction portion of the p-type electrode 212. A part of the reflected light is absorbed in the p-type InGaAs light absorbing layer 205. Electrons generated by photoelectric conversion of the light absorbed in the p-type InGaAs light absorbing layer 205 are accelerated by electric fields applied to the semiconductor multilayer 220 and pass through the n-type InAlAs multiplier layer 203. At this time, carriers are multiplied by an avalanche multiplication in the n-type InAlAs multiplier layer 203 and detected as a current.

A feature of the present invention is a shape of the upper surface of the reflecting layer 211 and a shape of the junction portion of the p-type electrode 212 which is the upper electrode.

Figure 3A:
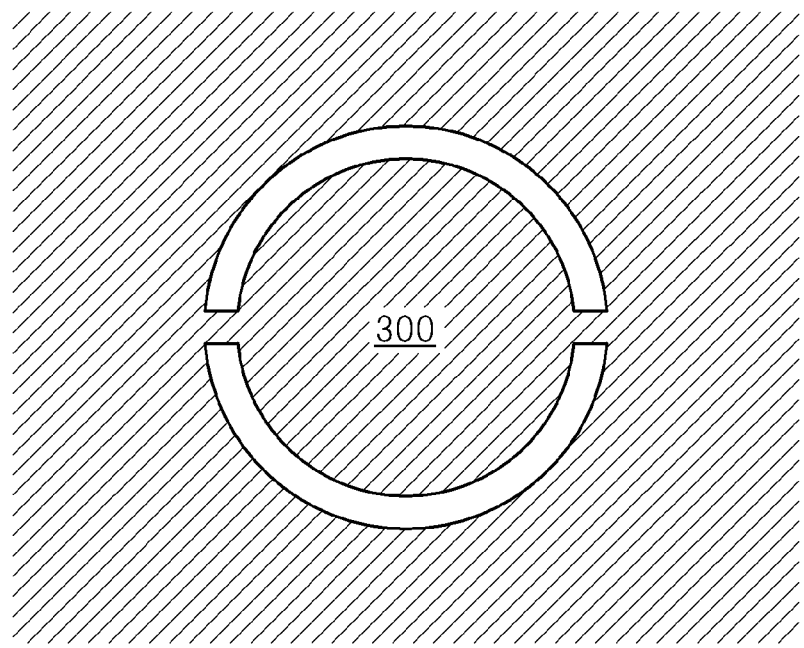
FIG. 3A illustrates a mask pattern of a photo resist (300) in a manufacturing method according to the first embodiment of the present invention.

FIG. 3A illustrates a mask pattern of a photo resist 300 in a manufacturing method according to this embodiment. The details of the manufacturing method are described below. During a manufacturing process, the reflecting film 211 is formed on the entire upper and oblique surface of the second mesa structure 210. The photo resist 300 is applied to the entire surface of the reflecting film 211. A photolithography technology is employed to expose two white substantially-semi-ring regions illustrated in FIG. 3A. Then, portions of the photo resist 300 which are located in the regions are removed to form only a remaining portion of the photo resist 300 illustrated in FIG. 3A, to thereby obtain the mask pattern. The mask pattern of the photo resist 300 illustrated in FIG. 3A is used to remove portions of the reflecting film 211 which are located in the two white substantially-semi-ring regions illustrated in FIG. 3A by an etching process, to thereby form the through holes. The junction portion of the p-type electrode 212 are formed in the through holes. The etching process may be wet etching, dry etching, or a combination thereof.

The mask pattern of the photo resist 300 illustrated in FIG. 3A corresponds to the shape of the upper surface of the reflecting layer 211 formed on the upper surface of the second mesa structure 210. The shapes of the two white substantially-semi-ring regions illustrated in FIG. 3A correspond to a cross sectional shape of the junction portion of the p-type electrode 212.

A region of the reflecting film 211 which corresponds to a circular region surrounded by the two white substantially-semi-ring regions illustrated in FIG. 3A is a principal reflecting region. Most of the light which enters from the rear surface of the rear-surface incident type APD, is reflected on the reflecting film 211, and then is absorbed in the p-type InGaAs light absorbing layer 205 is reflected on the principal reflecting region of the reflecting film 211.

The junction portion of the p-type electrode 212 surrounds a portion of the circumference of the principal reflecting region of the reflecting film 211. The principal reflecting region of the reflecting film 211 is connected to a region of the reflecting film 211 which is located outside the junction portion of the p-type electrode 212 through regions (connection regions) of the reflecting film 211 which correspond to regions located between end portions of the two white regions illustrated in FIG. 3A. In particular, the cross section of the junction portion of the p-type electrode 212 has a shape, in which a region extending to an outside from a portion (first portion) of the circumference of the principal reflecting region and another region extending to an outside from another portion (second portion) of the circumference of the principal reflecting region, both of which are opposed to each other with respect to the center of the principal reflecting region, are removed from a ring portion formed outside the circumference of the principal reflecting region of the reflecting film 211. That is, a region joining the two portions of the circumference of the principal reflecting region includes the center of the principal reflecting region.

The reflecting film 211 and the junction portion of the p-type electrode 212 in the rear-surface incident type APD according to this embodiment have the shape corresponding to the mask pattern of the photo resist 300 illustrated in FIG. 3A. Therefore, the principal reflecting region of the reflecting film 211 is inhibited from disappearing during the manufacturing process while the electrical connection between the p-type electrode 212 and the p-type InGaAs contact layer 207 is maintained. As a result, the rear-surface incident type APD according to this embodiment may be stably manufactured, to thereby improve a yield thereof. The principal reflecting region of the reflecting film 211 is stably formed, and hence the degree of freedom to design the shape of the reflecting film 211 and the shape of the junction portion of the p-type electrode 212 increases. That is, even when a device in which the diameter of the upper surface of the semiconductor multilayer 220 is small is to be manufactured, a limitation on the design of the mask pattern of the photo resist 300 may be suppressed.

With respect to the shape of the reflecting film 211 of the rear-surface incident type APD according to this embodiment, the principal reflecting region and the region located outside the principal reflecting region are connected through the connection regions located on both sides of the principal reflecting region in the lateral direction of FIG. 3A and passing through the center of the principal reflection region. That is, the principal reflecting region and the region located outside the principal reflecting region are connected through the two connection regions located on a straight line passing through the center of the principal reflecting region.

Therefore, the optical axis adjustment (alignment) of the incident light may be more accurately performed. For example, a case where light enters from an optical fiber line is considered. The optical fiber line is connected to an input portion (not shown) provided on a lower surface of the assembled finished product illustrated in FIG. 1A. In this case, a straight line passing through the center of a cross section of the optical fiber line (hereinafter, referred to as optical axis) along the optical fiber line desirably passes through the center of the principal reflecting region of the reflecting film 211 of the rear-surface incident type APD. In this case, the position of the optical fiber line relative to the rear-surface incident type APD is adjusted.

In the case of the semiconductor light receiving device according to the conventional technology, the entire circumference of the principal reflecting region of the reflecting film 211 is surrounded by the junction portion of the p-type electrode 212. Therefore, in a case where the optical fiber line from which a predetermined amount of light is exited is moved along the straight line passing through the center of the principal reflecting region, when the optical axis of the optical fiber line passes through the center of the principal reflecting region, the light receiving sensitivity of the semiconductor light receiving device is maximum. The light receiving sensitivity reduces as a distance from the center increases. When the optical axis passes through the junction portion of the p-type electrode 212, the light receiving sensitivity further reduces. When the optical axis passes through the outside of the junction portion of the p-type electrode 212, the light receiving sensitivity increases again. That is, the light receiving sensitivity gradually reduces from the center of the principal reflecting region to the outside. A small peak (shoulder) occurs in the vicinity of the junction portion of the p-type electrode 212, and hence it is very difficult to perform the optical axis adjustment (alignment) of the optical fiber line.

In contrast to this, in the case of the rear-surface incident type APD according to this embodiment, the reflecting film 211 is formed so that the principal reflecting region and the region located outside the principal reflecting region are connected through the connection regions which pass through the center of the principal reflecting region in the lateral direction of FIG. 3A. Therefore, when the optical axis adjustment of the optical fiber line is to be performed in the lateral direction, the light receiving sensitivity gradually reduces from the center of the principal reflecting region to the outside. However, the small peak (shoulder) corresponding to the vicinity of the junction portion of the p-type electrode 212, which is observed in the conventional technology, is suppressed, and hence the optical axis adjustment (alignment) of the optical fiber line may be more accurately performed. When the small peak (shoulder) corresponding to the vicinity of the junction portion of the p-type electrode 212 is observed during the optical axis adjustment of the optical fiber line, it is found that the optical axis is deviated from the straight line passing through the center of the principal reflecting region in the lateral direction of FIG. 3A.

Hereinafter, the method of manufacturing the rear-surface incident type APD according to this embodiment is described.

As illustrated in FIG. 2, the n-type InAlAs buffer layer 202, the n-type InAlAs multiplier layer 203, the p-type InAlAs electric field adjusting layer 204, the p-type InGaAs light absorbing layer 205, the p-type InAlGaAs cap layer 206, and the p-type InGaAs contact layer 207 are formed in this stated order on the n-type InP substrate 201 by a molecular beam epitaxial growth method.

After that, a circular hard mask is formed in an upper region. Then, the p-type InGaAs contact layer 207, the p-type InAlGaAs cap layer 206, the p-type InGaAs light absorbing layer 205, and a portion up to the intermediate portion of the p-type InAlAs electric field adjusting layer 204 are etched to form the first mesa structure 208. As described above, the first mesa structure 208 is indicated by the thick line of FIG. 2.

Next, a metal organic vapor phase epitaxy (hereinafter referred to as MOVPE) method is used to grow the buried layer 209 of InP doped with Fe around the first mesa structure 208 up to a height corresponding to the upper surface of the p-type InGaAs contact layer 207. After that, the hard mask is removed.

A photo resist having a circular two-dimensional pattern larger in diameter than the first mesa structure 208 is formed on the p-type InGaAs contact layer 207 and the buried layer 209. The photo resist is used as a mask to etch the buried layer 209, the p-type InAlAs electric field adjusting layer 204, the n-type InAlAs multiplier layer 203, the n-type InAlAs buffer layer 202, and a portion up to the intermediate portion of the n-type InP substrate 201 by a Br-based etching solution. When the process described above is performed, the second mesa structure 210 is formed around the first mesa structure 208. The second mesa structure 210 has a concentric two-dimensional pattern to the first mesa structure 208. As described above, the second mesa structure 210 is indicated by the broken line of FIG. 2.

The photo resist is removed, and then the insulating reflecting film 211 is formed on the entire surface of the n-type InP substrate 201. The reflecting film 211 includes an SiN layer and an $SiO_2$ layer. The photo resist 300 is applied to the surface of the reflecting film 211. After that, a photolithography technique is employed to form the mask pattern of the photo resist 300 illustrated in FIG. 3A above the semiconductor multilayer 220 and form a mask pattern (not shown) for connection to an n-type electrode (not shown) on a portion of the upper surface of the n-type InP substrate 201 which is located outside the second mesa structure 210. The photo resist 300 is used as a mask to remove portions of the reflecting film 211 by an etching process, to thereby form the through holes in portions of the upper surface of the p-type InGaAs contact layer 207 and portions (not shown) of the upper surface of the n-type InP substrate 201. As described above, the etching process may be wet etching, dry etching, or a combination thereof.

The p-type electrode 212 to be connected to the p-type InGaAs contact layer 207 and the n-type electrode to be connected to the n-type InP substrate 201 are formed. A titanium (Ti) layer, a platinum (Pt) layer, and a gold (Au) layer are laminated in this stated order using an evaporation method and patterned using a photolithography technology to form the p-type and n-type electrodes. The p-type electrode 212 is formed on the upper surface of the reflecting film 211, and hence a mirror function of a region of the reflecting film 211 on which the p-type electrode 212 is formed is further enhanced. The lower surface of the junction portion of the p-type electrode 212 also serves as a mirror.

Then, an antireflecting film 213 made of SiN is formed on the rear surface of the n-type InP substrate 201, that is, the lower surface of the n-type InP substrate 201 illustrated in FIG. 2 to complete a wafer. The wafer is divided for each device to manufacture the rear-surface incident type APD.

A Ti layer, a Pt layer, and an Au layer are laminated on the submount 102 made of aluminum nitride in this stated order using an evaporation method and patterned using a photo lithography technology to form the p-type electrode pattern 103 and the n-type electrode pattern 104. An AuSn solder evaporation pattern is formed in an end of the p-type electrode pattern 103 and an end of the n-type electrode pattern 104 to align the p-type electrode 212 and the n-type electrode of the APD device 101 which is the rear-surface incident type APD. A suitable load and heat are applied to connect the P-type electrode pattern 103 to the p-type electrode 212 and connect the n-type electrode pattern 104 to the n-type electrode by soldering at the same time, to thereby manufacture the assembled finished product.

As described above, when the mask pattern of the photo resist 300 illustrated in FIG. 3A is used to etch the reflecting film 211, the principal reflecting region of the reflecting film 211 may be inhibited from disappearing. According to the manufacturing method of this embodiment, the rear-surface incident type APD in this embodiment may be stably manufactured, to thereby improve a yield thereof. According to the manufacturing method of this embodiment, the degree of freedom to design the shape of the reflecting film 211 and the shape of the junction portion of the p-type electrode 212 increases.

[Second Embodiment]

A semiconductor light receiving device according to a second embodiment of the present invention is a rear-surface incident type APD. The rear-surface incident type APD according to this embodiment has the same fundamental structure as that of the rear-surface incident type APD according to the first embodiment. The rear-surface incident type APD according to this embodiment is different from the rear-surface incident type APD according to the first embodiment with respect to the shape of the upper surface of the reflecting film 211 and the shape of the junction portion of the p-type electrode 212 which is the upper electrode.

Figure 3B:
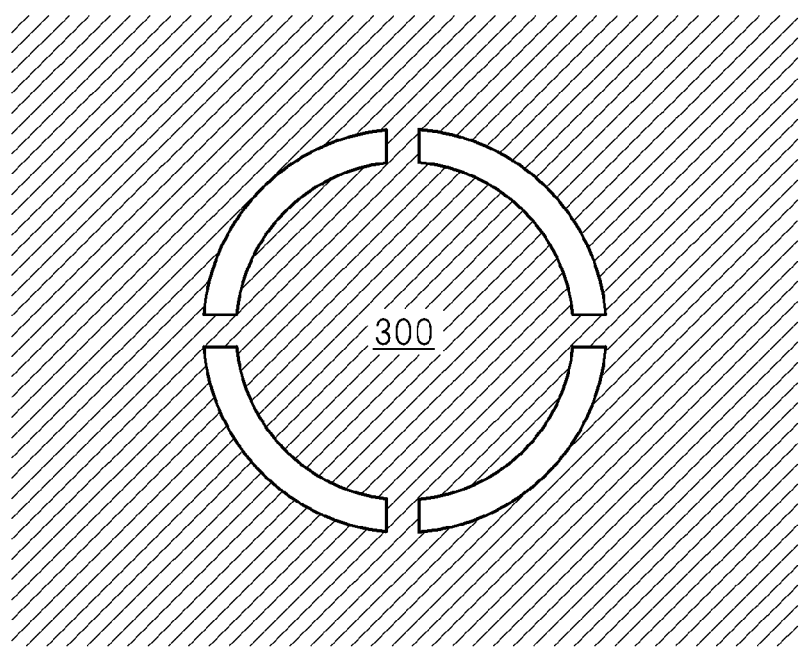
FIG. 3B illustrates a mask pattern of a photo resist (300) in a manufacturing method according to a second embodiment of the present invention.

FIG. 3B illustrates a mask pattern of a photo resist 300 in a manufacturing method according to this embodiment. As described above, the mask pattern of the photo resist 300 illustrated in FIG. 3B corresponds to the shape of the reflecting film 211 formed on the upper surface of the second mesa structure 210. A shape of four white substantially-quadrant-ring regions illustrated in FIG. 3B corresponds to a cross sectional shape of the junction portion of the p-type electrode 212.

In the reflecting film 211 of the rear-surface incident type APD according to the first embodiment, the principal reflecting region and the region located outside the principal reflecting region are connected through the two connection regions. In contrast to this, in the reflecting film 211 of the rear-surface incident type APD according to the second embodiment, the principal reflecting region and the region located outside the principal reflecting region are connected through four connection regions.

The principal reflecting region is connected to the region located outside the principal reflecting region through the four connection regions, and hence the reflecting film 211 may be more stably formed. The four connection regions are the two sets of connection regions located on two different straight lines passing through the center of the principal reflecting region, and hence the optical axis adjustment of incident light may be more accurately performed than in the rear-surface incident type APD according to the first embodiment.

[Third Embodiment]

A semiconductor light receiving device according to a third embodiment of the present invention is a rear-surface incident type APD. Similarly, the rear-surface incident type APD according to this embodiment is different from the rear-surface incident type APD according to the first embodiment with respect to the shape of the upper surface of the reflecting film 211 and the shape of the junction portion of the p-type electrode 212 which is the upper electrode.

Figure 3C:
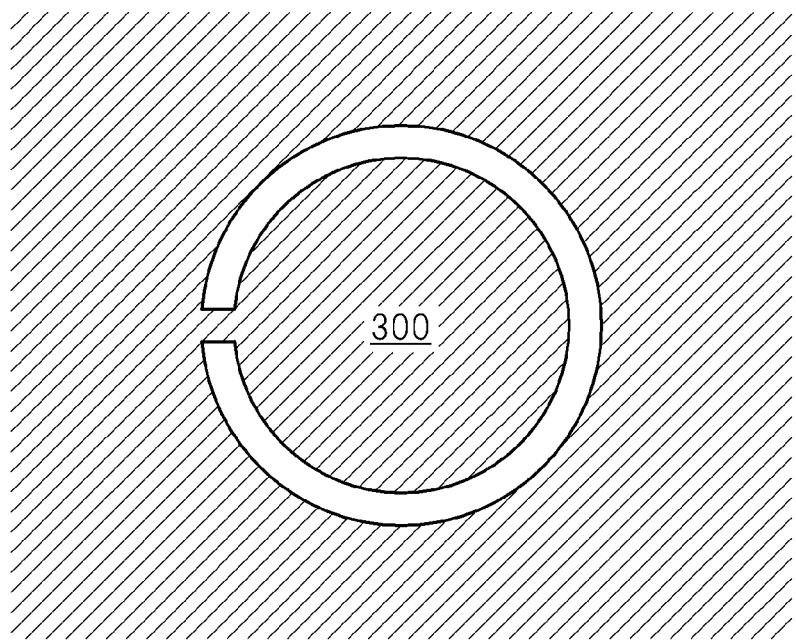
FIG. 3C illustrates a mask pattern of a photo resist (300) in a manufacturing method according to a third embodiment of the present invention.

FIG. 3C illustrates a mask pattern of a photo resist 300 in the manufacturing method according to this embodiment. Similarly, the shape of the reflecting film 211 corresponds to the mask pattern.

The principal reflecting region and the region located outside the principal reflecting region are connected to each other through a single connection region. A cross sectional shape of the junction portion of the p-type electrode 212 is correspondingly a C-shape.

When the rear-surface incident type APD according to this embodiment is compared with the rear-surface incident type APD according to each of the first and second embodiments, a structure is employed in which the electrical connection between the p-type electrode 212 and the p-type InGaAs contact layer 207 is emphasized. In addition to this, the connection region is provided, and hence the principal reflecting region may be inhibited from disappearing during the manufacturing process and the reflecting film 211 may be stably formed.

[Fourth Embodiment]

A semiconductor light receiving device according to a fourth embodiment of the present invention is a rear-surface incident type APD. Similarly, the rear-surface incident type APD according to this embodiment is different from the rear-surface incident type APD according to the first embodiment with respect to the shape of the upper surface of the reflecting film 211 and the shape of the junction portion of the p-type electrode 212 which is the upper electrode.

Figure 3D:
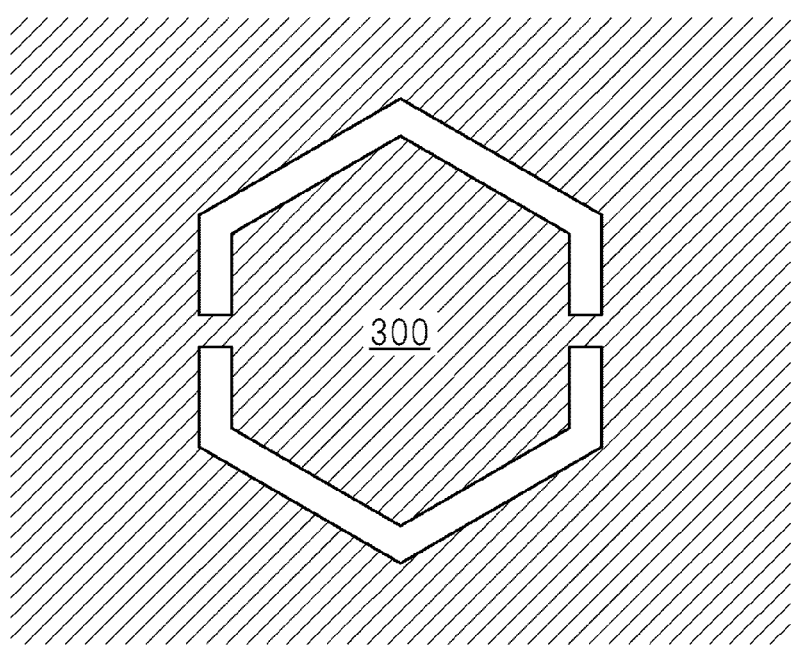
FIG. 3D illustrates a mask pattern of a photo resist (300) in a manufacturing method according to a fourth embodiment of the present invention.
Figure 4:
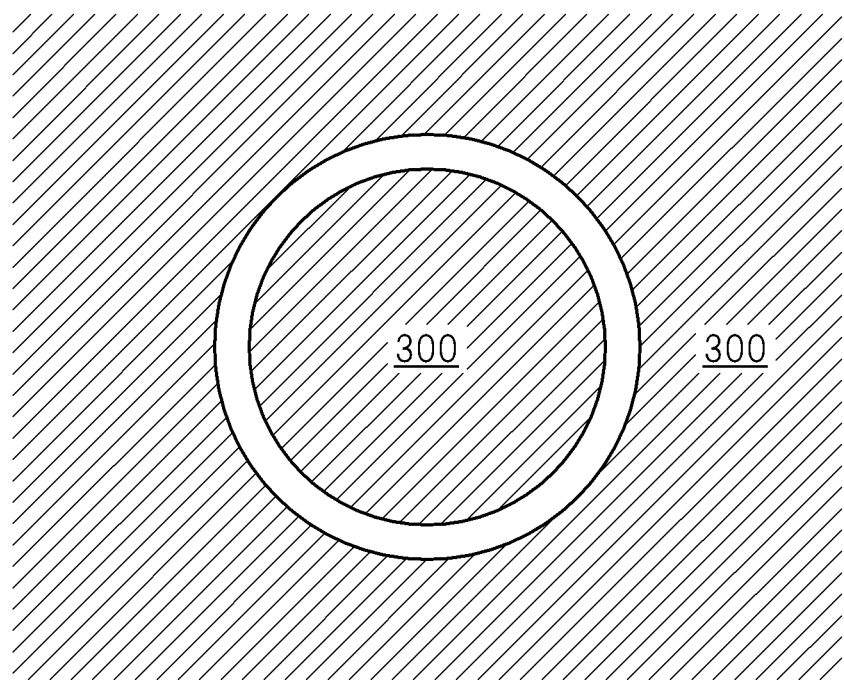
FIG. 4 illustrates a mask pattern of a photo resist in a manufacturing method according to a conventional technology.
Figure 5A:
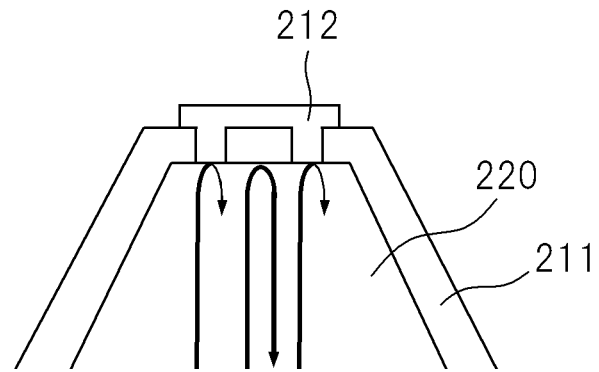
FIG. 5A is a schematic cross sectional view illustrating a semiconductor light receiving device normally manufactured by the manufacturing method according to the conventional technology.
Figure 5B:
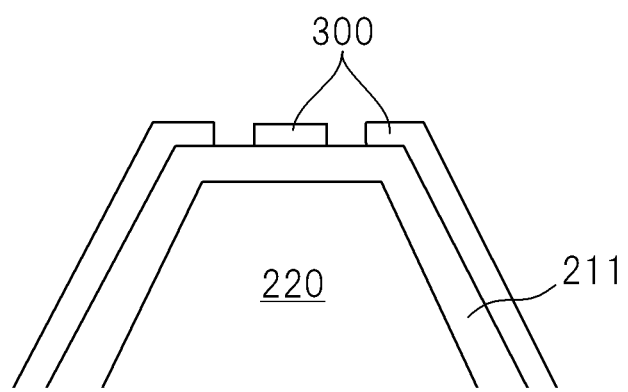
FIG. 5B is a cross sectional view after the formation of the mask pattern of the photo resist during a process for manufacturing the semiconductor light receiving device illustrated in FIG. 5A.
Figure 5C:
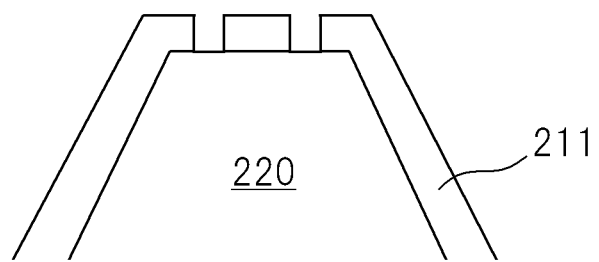
FIG. 5C is a cross sectional view after an etching process during the process for manufacturing the semiconductor light receiving device illustrated in FIG. 5A.
Figure 6A:
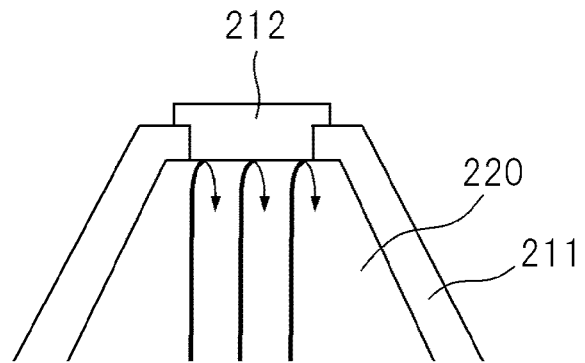
FIG. 6A is a schematic cross sectional view illustrating an example of a semiconductor light receiving device abnormally manufactured by the manufacturing method according to the conventional technology.
Figure 6B:
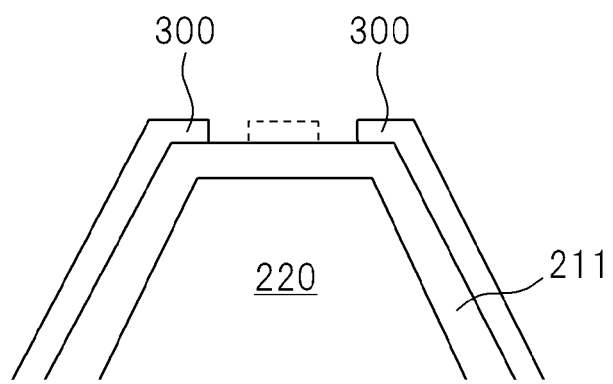
FIG. 6B is a cross sectional view after the formation of a mask pattern of a photo resist during a process for manufacturing the semiconductor light receiving device illustrated in FIG. 6A.
Figure 6C:
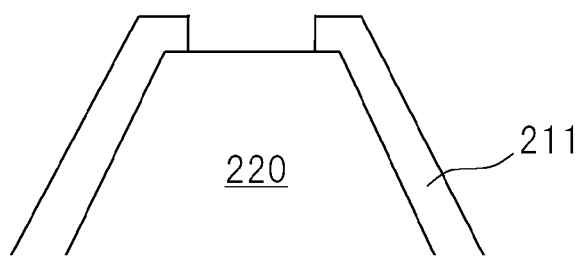
FIG. 6C is a cross sectional view after an etching process during the process for manufacturing the semiconductor light receiving device illustrated in FIG. 6A.
Figure 7A:
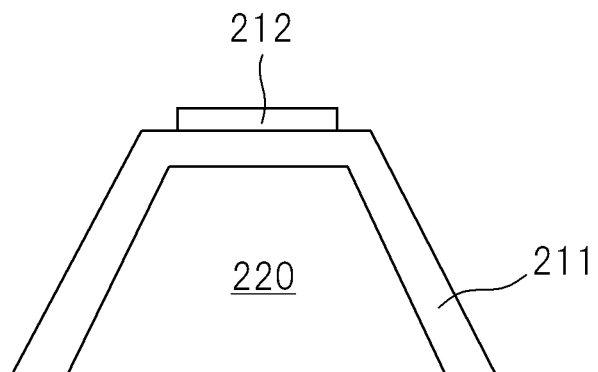
FIG. 7A is a schematic cross sectional view illustrating another example of a semiconductor light receiving device abnormally manufactured by the manufacturing method according to the conventional technology.
Figure 7B:
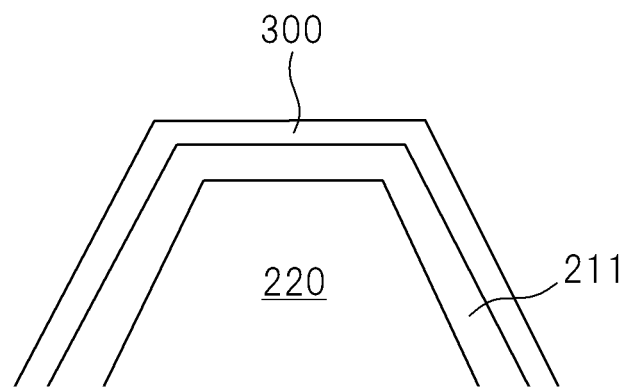
FIG. 7B is a cross sectional view after the formation of a mask pattern of a photo resist during a process for manufacturing the semiconductor light receiving device illustrated in FIG. 7A.
Figure 7C:
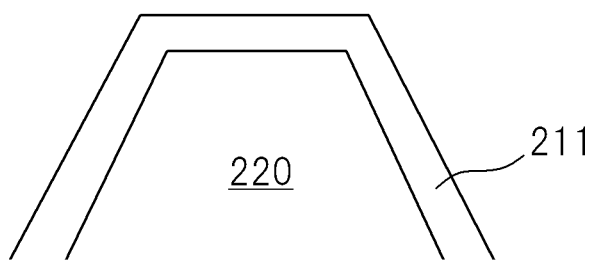
FIG. 7C is a cross sectional view after an etching process during the process for manufacturing the semiconductor light receiving device illustrated in FIG. 7A.

FIG. 3D illustrates a mask pattern of a photo resist 300 in the manufacturing method according to this embodiment. The principal reflecting region of the reflecting film 211 of the rear-surface incident type APD according to each of the first to third embodiments has the circular shape. However, the present invention is not limited to this shape. A principal reflecting region of the reflecting film 211 which corresponds to the mask pattern of the photo resist 300 illustrated in FIG. 3D has a regular hexagonal shape. The principal reflecting region is connected to a region located outside the principal reflecting region through two connection regions.

Even in the case of the rear-surface incident type APD according to this embodiment, the two connection regions are provided, and hence the reflecting film 211 may be more stably formed. As in the case of the rear-surface incident type APD according to the first embodiment, the optical axis adjustment of incident light may be more accurately performed.

Therefore, the shape of the principal reflecting region of the reflecting film 211 is not limited to the circular shape and may be the hexagonal shape or an octagonal shape. However, in view of the isotropy of the light receiving sensitivity of the semiconductor light receiving device, a regular n-polygonal shape is desired. An n-polygonal shape having a larger number of n is desired.

When the shape of the principal reflecting region is a regular n-polygonal shape, where n is an even number, as in the case of the circular shape, connection portions are partially provided in two opposite sides of a circumference of the principal reflecting region. When a region joining the two connection portions includes the center of the regular n-polygonal shape, the optical axis adjustment of incident light may be more accurately performed.

The semiconductor light receiving device according to the present invention is not limited to the rear-surface incident type APD according to each of the embodiments described above. The semiconductor light receiving device according to the present invention may be a rear-surface incident type APD having a single mesa structure in which the buried layer 209 is not provided. The present invention may be applied to a case where a mesa structure is not provided and the respective layers of the semiconductor multilayer 220 have the same cross section. The semiconductor light receiving device according to the present invention may be a rear-surface incident type pin photo diode or another semiconductor light receiving device.

While there have been described what are at present considered to be certain embodiments of the invention, it will be understood that various modifications may be made thereto, and it is intended that the appended claims cover all such modifications as fall within the true spirit and scope of the invention.

What is claimed is:

1. A semiconductor light receiving device, comprising:
a semiconductor substrate;
a semiconductor layer which is laminated on the semiconductor substrate and includes an upper surface portion;
a reflecting film which is formed to cover the upper surface portion of the semiconductor layer and which has at least one through hole being configured to form in the reflecting film a discontinuous loop, the reflecting film including a principal reflecting region and a peripheral reflecting region surrounding the principal reflecting region; and
an upper electrode which is formed to cover at least a portion of an upper surface of the reflecting film and includes a junction portion extending through the at least one through hole of the reflecting film to be provided in contact with the upper surface portion of the semiconductor layer, the junction portion of the upper electrode surrounding only a portion of a circumference of the principal reflecting region of the reflecting film, the principal reflecting region being connected to the peripheral reflecting region which is located outside the junction portion,
wherein the semiconductor light receiving device detects light entering from a side of the semiconductor substrate which is opposed to the semiconductor layer.

2. The semiconductor light receiving device according to claim 1, wherein:
the principal reflecting region of the reflecting film has a circular shape; and
the junction portion of the upper electrode which is provided in contact with the circumference of the principal reflecting region has a cross section obtained by removing, from a ring-shaped region formed outside the circumference of the principal reflecting region having the circular shape, and a region extending from at least one portion of the circumference of the principal reflecting region having the circular shape to an outside.

3. The semiconductor light receiving device according to claim 2, wherein the at least one portion of the circumference of the principal reflection region includes a first portion of the circumference of the principal reflecting region having the circular shape and a second portion of the circumference of the principal reflecting region having the circular shape, the first portion and the second portion being opposed to each other with respect to a center of the principal reflecting region having the circular shape.

4. A semiconductor light receiving device, comprising:
a semiconductor substrate;
a semiconductor layer which is laminated on the semiconductor substrate and includes an upper surface portion;
a reflecting film which is formed to cover the upper surface portion of the semiconductor layer and includes a principal reflecting region and a peripheral reflecting region surrounding the principal reflecting region; and
an upper electrode which is formed to cover at least a portion of an upper surface of the reflecting film;
wherein at least one through hole in the reflecting film is configured to partially surround the principal reflecting region of the reflecting film;
wherein the reflecting film is configured to form a shape connecting the principal reflecting region which is partially surrounded by the at least one through hole and the peripheral reflecting region outside the at least one through hole, and
wherein the upper electrode and the semiconductor layer are electrically connected through the at least one through hole.

5. The semiconductor light receiving device according to claim 4,
wherein the principal reflecting region is configured to form a circle,
wherein the at least one through hole is configured to form a discontinuous loop with at least one missing portion, and
wherein the principal reflecting region which is partially surrounded by the at least one through hole is connected with the peripheral reflecting region through the at least one missing portion of the at least one through hole.

* * * * *